US006559056B2

(12) United States Patent
Hattori et al.

(10) Patent No.: US 6,559,056 B2
(45) Date of Patent: May 6, 2003

(54) AQUEOUS DISPERSION FOR CHEMICAL MECHANICAL POLISHING

(75) Inventors: Masayuki Hattori, Tokyo (JP); Hitoshi Kishimoto, Tokyo (JP); Nobuo Kawahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/858,924

(22) Filed: May 17, 2001

(65) Prior Publication Data

US 2002/0011031 A1 Jan. 31, 2002

(30) Foreign Application Priority Data

May 18, 2000 (JP) ........................................ 2000-146666

(51) Int. Cl.$^7$ ............................................ H01L 21/302
(52) U.S. Cl. ............................. 438/693; 51/306; 51/307
(58) Field of Search ............................ 430/690–693; 51/306–310; 216/88–90

(56) References Cited

U.S. PATENT DOCUMENTS

| | | | | |
|---|---|---|---|---|
| 6,045,605 A | * | 4/2000 | Doi et al. ................... | 438/693 |
| 6,098,638 A | * | 8/2000 | Miyashita et al. ............ | 216/89 |
| 6,143,662 A | * | 11/2000 | Rhoades et al. ............ | 438/690 |
| 6,312,487 B1 | * | 11/2001 | Tanaka ........................ | 51/309 |
| 6,343,976 B1 | * | 2/2002 | Yoshida et al. .............. | 451/41 |

FOREIGN PATENT DOCUMENTS

| | | | | |
|---|---|---|---|---|
| JP | 7-86216 | 3/1995 | | |
| JP | 9-285957 | 11/1997 | | |
| JP | 10-168431 | 6/1998 | | |
| JP | 10-231473 | 9/1998 | | |
| JP | 10-270400 | 10/1998 | | |
| JP | WO99/31195 | * | 6/1999 | ............ C09K/3/14 |
| JP | 02000186277 A | * | 7/2000 | ............ C09K/3/14 |

OTHER PUBLICATIONS

Lewis, Condensed Chemical Dictionary, 1997, 13rd edition p. 840.*

* cited by examiner

Primary Examiner—Benjamin L. Utech
Assistant Examiner—Duy-Vu Deo
(74) Attorney, Agent, or Firm—Oblon, Spivak, McClelland, Maier & Neustadt, P.C.

(57) ABSTRACT

The object of the present invention is to provide an aqueous dispersion for chemical mechanical polishing which can be polished working film for semiconductor devices and which is useful for STI. The aqueous dispersion for chemical mechanical polishing of the invention is characterized by comprising an inorganic abrasive such as silica, ceria and the like, and organic particles composed of a resin having anionic group such as carboxyl group into the molecular chains. The removal rate for silicon oxide film is at least 5 times, particularly 10 times the removal rate for silicon nitride film. The aqueous dispersion may also contain an anionic surfactant such as potassium dodecylbenzene sulfonate and the like. And a base may also be included in the aqueous dispersion for adjustment og the pH to further enhance the dispersability, removal rate and selectivity.

18 Claims, No Drawings

AQUEOUS DISPERSION FOR CHEMICAL MECHANICAL POLISHING

BACKGROUND OF THE INVENTION

The present invention relates to an aqueous dispersion for chemical mechanical polishing. More specifically, it relates to an aqueous dispersion for chemical mechanical polishing that is particularly useful for chemical mechanical polishing of insulating films during the manufacturing steps for semiconductor devices.

Improvements in degrees of semiconductor device integration and increased multilayer wiring have led to drastic increases in storage volumes of memory devices. This has been supported by advances in micronization for the working techniques, increased multilayer wiring and the steps for micronization are increasing correspondingly, thus leading to higher chip costs. Given such circumstances, chemical mechanical polishing techniques for polishing of working film and the like been introduced and attention is being directed toward these techniques. Application of such chemical mechanical polishing techniques has allowed planarization and numerous micronization techniques.

One of these micronization techniques is Shallow Trench Isolation, also known as STI. The important factor for the STI technique is the removal rate ratio between the silicon nitride film used as the stopper film and the silicon oxide film, or the "selectivity", and an optimum polishing agent is necessary.

SUMMARY OF THE INVENTION

In light of the state of the aforementioned STI technique, it is an object of the present invention to provide an aqueous dispersion for chemical mechanical polishing with a high removal rate for silicon oxide film and a low removal rate for silicon nitride film, i.e. a high selectivity.

The present invention is as follows.

1. An aqueous dispersion for chemical mechanical polishing characterized by comprising an inorganic abrasive and organic particles with anionic group, wherein the removal rate for silicon oxide film is at least 5 times the removal rate for silicon nitride film.

2. An aqueous dispersion for chemical mechanical polishing according to 1. above, wherein the abovementioned anionic group is at least one selected from among carboxyl group, hydroxyl group, sulfuric acid ester group, sulfonic acid group, phosphoric acid group and epoxy group.

3. An aqueous dispersion for chemical mechanical polishing according to 2. above, wherein the abovementioned inorganic abrasive is at least one selected from the group consisting of silica, ceria, alumina, titania and zirconia.

4. An aqueous dispersion for chemical mechanical polishing according to 3. above, wherein the zeta potential of the abovementioned organic particles with the abovementioned anionic group is −10 mV or lower.

5. An aqueous dispersion for chemical mechanical polishing according to 2. above, wherein the abovementioned inorganic abrasive is fumed silica or colloidal silica.

6. An aqueous dispersion for chemical mechanical polishing according to 5. above, wherein the zeta potential of the abovementioned organic particles with the abovementioned anionic group is −10 mV or lower.

7. An aqueous dispersion for chemical mechanical polishing according to 6. above, wherein the zeta potential of the abovementioned organic particles with the abovementioned anionic group is −20 mV or lower.

8. An aqueous dispersion for chemical mechanical polishing according to 7. above, which is used for a shallow trench isolation step in the manufacture of a semiconductor device.

9. An aqueous dispersion for chemical mechanical polishing according to 1. above, which further comprises an anionic surfactant, wherein when the abovementioned inorganic abrasive is silica, the removal rate for silicon oxide film is at least 6 times the removal rate for silicon nitride film.

10. An aqueous dispersion for chemical mechanical polishing according to 9. above, wherein the abovementioned anionic group is at least one selected from among carboxyl group, hydroxyl group, sulfuric acid ester group, sulfonic acid group, phosphoric acid group and epoxy group.

11. An aqueous dispersion for chemical mechanical polishing according to 10. above, wherein the zeta potential of the abovementioned organic particles with the abovementioned anionic group is −10 mV or lower.

12. An aqueous dispersion for chemical mechanical polishing according to 11. above, which is used for a shallow trench isolation step in the manufacture of a semiconductor device.

13. An aqueous dispersion for chemical mechanical polishing according to 1. above, which further comprises an anionic surfactant, wherein when the abovementioned inorganic abrasive is ceria, the removal rate for silicon oxide film is at least 10 times the removal rate for silicon nitride film.

14. An aqueous dispersion for chemical mechanical polishing according to 13. above, wherein the abovementioned anionic group is at least one selected from among carboxyl group, hydroxyl group, sulfuric acid ester group, sulfonic acid group, phosphoric acid group and epoxy group.

15. An aqueous dispersion for chemical mechanical polishing according to 14. above, wherein the zeta potential of the abovementioned organic particles with the abovementioned anionic group is −10 mV or lower.

16. An aqueous dispersion for chemical mechanical polishing according to 15. above, which is used for a shallow trench isolation step in the manufacture of a semiconductor device.

According to the invention, it is possible to obtain an aqueous dispersion for chemical mechanical polishing which is useful for STI steps, to allow polishing of silicon oxide film at an adequate rate while maintaining an adequately high selectivity as the ratio with respect to the removal rate for silicon nitride film, and without producing scratching or dishing.

DETAILED DESCRIPTION OF THE INVENTION

The aqueous dispersion for chemical mechanical polishing of the invention is characterized by comprising an inorganic abrasive and organic particles with anionic group, wherein the removal rate for silicon oxide film is at least 5 times the removal rate for silicon nitride film.

The "inorganic abrasive" may be silica, ceria, alumina, titania, zirconia or the like, and particularly preferred are silica and ceria. The silica used may be (1) fumed silica obtained by reacting silicon chloride in the presence of hydrogen and oxygen, (2) colloidal silica obtained by ion-exchange of a silicic acid salt, or (3) colloidal silica obtained by hydrolysis or condensation of a metal alkoxide. The ceria used may be obtained by firing of cerium carbonate, cerium hydroxide or cerium oxalate, but ceria obtained by firing of cerium carbonate is particularly preferred. The inorganic abrasive used may be of a single type, but combinations of two or more, such as silica and ceria, silica and alumina or ceria and alumina may also be used.

The average particle size of the inorganic abrasive is preferably 0.01–3 μm, because when the average particle size is less than 0.01 μm it is not possible to obtain an aqueous dispersion with an adequately high removal rate. On the other hand, if the average particle size is greater than 3 μm, the inorganic abrasive settles and easily separates, thus making it difficult to achieve a stable aqueous dispersion. The average particle size is more preferably 0.02–1.0 μm, and even more preferably 0.04–0.7 μm. An inorganic abrasive with an average particle size within this range gives a stable aqueous dispersion for chemical mechanical polishing with a high removal rate, and minimal settling or separation of the abrasive. The average particle size can be measured with a dynamic light scattering type measuring instrument, a laser diffusion diffraction type measuring instrument or the like, or it may be measured by observation with a transmission electron microscope. It may also be calculated based on the specific surface area of the powdered inorganic abrasive.

The content of the inorganic abrasive in the aqueous dispersion will depend on the type of inorganic abrasive, but for silica it may be 2–20 parts by weight (hereunder referred to as "parts"), preferably 4–15 parts and more preferably 6–12 parts, with respect to 100 parts of the aqueous dispersion. If the silica content is less than 2 parts, the removal rate is not adequately improved, and if it is more than 20 parts, the stability of the aqueous dispersion tends to be lower, which is undesirable in terms of cost. For ceria, it may be 0.02–5 parts, preferably 0.05–2 parts and more preferably 0.1–1 part with respect to 100 parts of the aqueous dispersion. The ceria content is preferably not below this range or above this range, because the same problems occur as with silica.

The "organic particles" with anionic group may be composed of a resin having anionic group introduced into the molecular chains.

As resin with anionic group introduced into the molecular chains there may be mentioned thermoplastic resin, which include polyvinyl chloride, polystyrene and styrene-based copolymer, polyolefin and polyolefin copolymer such as polyacetal, saturated polyester, polyamide, polycarbonate, polyethylene, polypropylene, poly-1-butene, poly-4-methyl-1-pentene and the like, as well as phenoxy resin, (meth) acrylic resin such as polymethyl methacrylate, and (meth) acrylic copolymer.

There may also be mentioned copolymer resin with crosslinked structures obtained by copolymerization of styrene, methyl methacrylate and the like. with divinylbenzene, ethylene glycol dimethacrylate and the like. There may also be mentioned thermosetting resin such as phenol resin, urea resin, melamine resin, epoxy resin, alkyd resin and unsaturated polyester resin.

The organic particles may be produced by any of various methods including emulsion polymerization, suspension polymerization, emulsified dispersion, pulverization or the like. The organic particles used may be of one type or a combination of two or more types.

The "anionic group" may be functional group that can render the zeta potential of the organic particles negative in the aqueous dispersion, and they are not particularly restricted. Specifically, there may be mentioned carboxyl group, hydroxyl group, sulfuric acid ester group, sulfonic group, phosphoric group and epoxy group. Carboxyl group and sulfonic acid group are preferred among these, and carboxyl group is particularly preferred. Organic particles with cationic group result in a relatively lower removal rate for silicon oxide film.

The zeta potential of the organic particles with the anionic group when measured in the water as same pH as the polishing slurry is −10 mV or lower, and preferably −20 mV or lower. The lower limit is normally −100 mV.

The average particle size of the organic particles is preferably 0.01–3 μm. If the average particle size is less than 0.01 μm, the ratio of the removal rate for silicon oxide film with respect to the removal rate for silicon nitride film is reduced, such that the selectivity may not be improved. On the other hand, if the average particle size is greater than 3 μm, the organic particles settle and easily separate, thus making it difficult to achieve a stable aqueous dispersion. The average particle size is more preferably 0.02–1.0 μm, and even more preferably 0.04–0.7 μm. Organic particles with an average particle size within this range result in a stable aqueous dispersion for chemical mechanical polishing with a high selectivity, and minimal settling or separation of the particles. The average particle size can be measured in the same manner as for the inorganic abrasive.

The organic particle content in the aqueous dispersion will depend on the type and the average particle size of the -inorganic abrasive, but in the case of a silica inorganic abrasive it may be 0.05–10 parts, preferably 0.1–5 parts and more preferably 0.2–3 parts, with respect to 100 parts of the aqueous dispersion. If the organic particle content is less than 0.05 part, the selectivity is not adequately improved, and if it is more than 10 parts, the stability of the aqueous dispersion tends to be lower, which is undesirable in terms of cost. In the case of a ceria inorganic abrasive, the organic particle content may be 0.02–5 parts, preferably 0.05–2 parts and more preferably 0.1–1 part with respect to 100 parts of the aqueous dispersion. The organic particle content is preferably not below this range or above this range, because the same problems occur as with a silica inorganic abrasive.

The inorganic abrasive and organic particles do not necessarily need to be dispersed in a mutually independent state. For example, an alkoxysilane may be polycondensed together with the inorganic abrasive and organic particles, with the polysiloxane bonded to at least the surface of the organic particles, and with the inorganic abrasive such as silica or ceria also bonded by electrostatic force. The resulting polysiloxane in this case may be directly bonded to the anionic group of the organic particles, or it may be indirectly bonded through a silane coupling agent or the like.

The medium for the aqueous dispersion may be water or a mixed medium composed mostly of water, such as a mixture of water and methanol, but water alone is particularly preferred.

The aqueous dispersion for chemical mechanical polishing according to the invention comprises an inorganic abrasive, organic particles and water, to provide a polishing agent with high selectivity and excellent performance, which can be used in STI steps for manufacture of semiconductor devices. With conventionally used silica, the selectivity is about 2–3, but according to the invention, the use of a combination of organic particles with anionic group and silica allows a selectivity of 5 or more. When ceria is used as the inorganic abrasive or the conditions are optimized, the selectivity can be increased to 10 or more, 20 or more and even 30 or more.

It is also possible to increase the selectivity by further including an anionic surf actant. For example, when silica is used as the inorganic abrasive, the selectivity can be increased to 6 or more. When ceria is used as the inorganic abrasive, the selectivity can be increased to 10 or more, 20 or more and even 30 or more.

The aqueous dispersion of the invention may also include various additives to further enhance its performance.

By adding an acid it is possible to stabilize the aqueous dispersion, which will further increase the selectivity in some cases. The acid is not particularly restricted, and any organic acid or inorganic acid may be used. As organic acids there may be mentioned para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, phthalic acid and the like. As inorganic acids there may be mentioned nitric acid, hydrochloric acid, sulfuric acid and the like. These organic acids or inorganic acids may be used alone or in combinations of two or more, and organic acids and inorganic acids may also be used together. These acids may be included at 0.02–2 parts and especially 0.05–1 part with respect to 100 parts of the aqueous dispersion.

A base may also be included in the aqueous dispersion for adjustment of the pH to further enhance the dispersability, removal rate and selectivity. The pH is not particularly restricted but will normally be about 5–12 and preferably 6–11. The base is also not particularly restricted, and any organic or inorganic base may be used. As organic bases there may be mentioned nitrogen-containing organic compounds such as ethylenediamine, ethanolamine and the like. As inorganic bases there may be mentioned ammonia, potassium hydroxide, sodium hydroxide, lithium hydroxide and the like, and these bases may be used alone or in combinations of two or more. The content of these bases is important for adjustment of the pH, but they may be added at 0.01–1 part and especially 0.02–0.5 part with respect to 100 parts of the aqueous dispersion. The preferred pH will differ depending on the inorganic abrasive, and in the case of silica the pH is preferably 10–12, while in the case of ceria the pH is preferably 5–12; these pH ranges are preferred to allow both enhanced removal rate and selectivity.

The aqueous dispersion may also contain, as additional additives, oxidizing agents, polyvalent metal ions, surfactants and the like.

As oxidizing agents, hydrogen peroxide, peroxosulfate, heteropolyacid and the like can be used. As polyvalent metal ions, alminium, titan, chromium, vanadium and the like can be used.

The surfactants may be anionic surfactant, nonionic surfactant, cationic surfactant or amphoteric surfactant, but anionic surfactant are preferred. As examples of anionic surfactant there may be mentioned potassium dodecylbenzene sulfonate, ammonium dodecyl sulfate and the like. The contents of these anionic surfactant may be 0 to 0.5 wt %, preferably 0.005 to 0.2 wt % and more preferably 0.01 to 0.1 wt % with respect to the aqueous dispersion.

There may also be added dispersing agents such as polyacrylic acid and viscosity adjustors such as polyacrylamide.

In the aqueous dispersion of the invention, the aforementioned additives are combined with the inorganic abrasive and the organic particles with anionic group as necessary, to allow further enhancement of the selectivity in STI steps.

When an aqueous dispersion for chemical mechanical polishing according to the invention is used for chemical mechanical polishing of a polishing surface, the polishing may be carried out under prescribed conditions using a commercially available chemical mechanical polishing apparatus (for example, Model "EPO-112" and "EPO-222" by Ebara Corporation, Model "LGP510" or "LGP552" by Lapmaster SFT Co., Ltd.; Article name "Mirra" by Applied Materials Corp.; Article name "Teres" by Lam Research Corp. and Model "AVANTI 472" by Speed Fam-IPEC Corp.).

DESCRIPTION OF THE PREFERRED EMBODIMENTS

The present invention will now be explained in further detail by way of examples.

(1) Synthesis of Organic Particles

SYNTHESIS EXAMPLE 1

[Synthesis of Organic Particles: Anionic Polymethyl Methacrylate (Anionic PMMA) Particles]

After loading 96 parts of methyl methacrylate, 4 parts of methacrylic acid, 0.1 part of ammonium lauryl sulfate, 0.5 part of ammonium persulfate and 400 parts of ion-exchange water into a 2-liter flask, the temperature was raised to 70° C. while stirring in a nitrogen gas atmosphere, for 6 hours of polymerization. This yielded an aqueous dispersion comprising carboxyl group- and sulfuric acid ester group-containing anionic PMMA particles with an average particle size of 0.2 μm. The polymerization yield was 95%, and the carboxyl group distribution as measured by conductometric titration was 40% inside the particles, 50% on the particle surfaces and 10% in the aqueous phase. The zeta potential was −25 mV as measured with a laser Doppler electrophoresis light scattering zeta potential meter (Type "DELSA440" by COULTER Corp.)

SYNTHESIS EXAMPLE 2

[Synthesis of Organic Particles: Anionic Polystyrene (Anionic PS) Particles]

After loading 96 parts of styrene, 4 parts of methacrylic acid, 0.1 part of ammonium lauryl sulfate, 0.5 part of ammonium persulfate and 400 parts of ion-exchange water into a 2-liter flask, the temperature was raised to 80° C. while stirring in a nitrogen gas atmosphere, for 12 hours of polymerization. This yielded an aqueous dispersion comprising carboxyl group- and sulfuric acid ester group-containing anionic PS particles with an average particle size of 0.2 μm. The polymerization yield was 95%, and the carboxyl group distribution as measured by conductometric titration was 40% inside the particles, 50% on the particle surfaces and 10% in the aqueous phase. The zeta potential was −36 mV as measured in the same manner as Synthesis Example 1.

COMPARATIVE SYNTHESIS EXAMPLE 1

[Synthesis of Cationic PMMA Particles]

After loading 95 parts of methyl methacrylate, 5 parts of 4-vinylpyridine, 2 parts of an azo-based polymerization initiator (trade name "V50" by Wako Junyaku Co., Ltd.) and 400 parts of ion-exchange water into a 2-liter flask, the temperature was raised to 70° C. while stirring in a nitrogen gas atmosphere, for 8 hours of polymerization. This yielded amino group-containing cationic PMMA particles with an average particle size of 0.2 μm. The polymerization yield was 96%. Comparative Synthesis Example 2 [Synthesis of cationic PS particles]

After loading 95 parts of styrene, 5 parts of 4-vinylpyridine, 2 parts of an azo-based polymerization initiator (trade name "V50" by Wako Junyaku Co., Ltd.) and 400 parts of ion-exchange water into a 2-liter flask, the temperature was raised to 75° C. while stirring in a nitrogen gas atmosphere, for 14 hours of polymerization. This yielded amino group-containing cationic PS particles with an average particle size of 0.2 μm. The polymerization yield was 94%.

(2) Aqueous Dispersion Containing Silica as Inorganic Abrasive, and Chemical Mechanical Polishing Employing the Same

EXAMPLE 1

An aqueous dispersion was prepared by adding the anionic PMMA particles of Synthesis Example 1 in an amount of 2 wt % to an aqueous dispersion containing 10 wt % fumed silica (#90, product of Nihon Aerosil Co., Ltd.) and 0.2 wt % KOH.

This aqueous dispersion was used for chemical mechanical polishing under the following conditions.

A 1000 nm thick thermal silicon oxide film and a 200 nm thick silicon nitride blanket wafer were set in a chemical mechanical polishing apparatus (Model "EPO-112", product of Ebara Corporation). A porous polyurethane polishing pad (product name: "IC1000" by Rodel-Nitta Corp.) was used for polishing of a urethane pad surface for 3 minutes under a load of 300 g/cm$^2$, with a table rotation rate of 50 rpm and a head rotation rate of 50 rpm while supplying the aforementioned aqueous dispersion at a rate of 200 cc/min. As a result, the removal rate on the silicon oxide film was 144 nm/min while the removal rate on the silicon nitride blanket wafer was 28.2 nm/min. Thus, the selectivity was adequately high at 5.1, and no scratches were produced, thus demonstrating that the aqueous dispersion has adequate performance for STI steps.

The number of scratches was measured with a non-patterned wafer surface foreign matter scanning apparatus ("Surfaces can 6420", product of KLA Tencor Co., Ltd.) after polishing an 8-inch thermal oxidation wafer for 2 minutes in the same manner. The numbers of scratches in the following examples and comparative examples were measured in the same manner.

EXAMPLES 2–7 AND COMPARATIVE EXAMPLES 1–4

The removal rates and numbers of scratches on thermal silicon oxide film and silicon nitride blanket wafers were evaluated in the same manner as Example 1, using the types of silica, organic particles and additives shown in Table 1.

In Table 1, DBS-K is dodecylbenzenesulfonic acid potassium salt, PAA-K is polyacrylic acid potassium salt (molecular weight: 25,000), and IPS-K is polyisoprenesulfonic acid potassium salt (molecular weight: 8000). The colloidal silica used was prepared by solvent replacement of water in a condensate of tetraethoxysilane in an ethanol/water mixed solvent using ammonia as the catalyst, as described in J. of Colloid and Interface Science, 25, 62–69 (1968). Particle size control was accomplished by adjusting the ethanol and water composition.

The results are listed in Table 1 together with the results for Example 1.

selectivities in Comparative Examples 2 and 3 were even lower and the removal rates were low, demonstrating that they are not suitable for practical use.

(3) Aqueous Dispersion Containing Ceria as Inorganic Abrasive, and Chemical Mechanical Polishing Employing the Same

EXAMPLE 8

Using bastnaesite as the starting material, this was subjected to alkali treatment and then dissolved in nitric acid and subjected to extraction with an organic solvent to remove the impurities, and then after dissolution in nitric acid, it was recrystallized 3 times as a carbonate salt to obtain a highly pure carbonate salt of cerium. This was fired at 900° C. to obtain ceria. The ceria was dispersed in ion-exchange water to a content of 0.3 wt %, and the pH was adjusted to 6.5 with ammonia to obtain an aqueous dispersion containing ceria with an average particle size of 0.24 μm. Next, the anionic PMMA particles of Synthesis Example 1 were added to a content of 0.7 wt %, to prepare an aqueous dispersion.

This aqueous dispersion was used to evaluate the removal rates on a thermal silicon oxide film and silicon nitride blanket wafer in the same manner as Example 1, except that the load was 250 g/cm$^2$ and the polishing time was 3 minutes. As a result, the removal rate on the silicon oxide film was 299 nm/min while the removal rate on the silicon nitride blanket wafer was 13.6 nm/min. Thus, the selectivity was adequately high at 22, and no scratches were produced, thus demonstrating the aqueous dispersion to have adequate performance for STI steps.

EXAMPLES 9–16 AND COMPARATIVE EXAMPLES 5–10

The removal rates and numbers of scratches on thermal silicon oxide film and silicon nitride blanket wafers were evaluated in the same manner as Example 8, using the ceria concentrations, the types and concentrations of organic particles and the types of additives shown in Table 2.

TABLE 1

| | | Inorganic abrasive Type/content | Organic particles Type/content | Zeta potential | Additive (0.02 wt %) | SiO$_2$ removal rate (nm/min) | Si$_3$N$_4$ removal rate (nm/min) | Selectivity | Scratches (number) |
|---|---|---|---|---|---|---|---|---|---|
| Examples | 1 | #90 fumed silica/10 | Anionic PMMA/2 | −25 | — | 144 | 28.2 | 5.1 | 0 |
| | 2 | | | | DBS-K | 123 | 19.5 | 6.3 | |
| | 3 | | | | PAA-K | 107 | 13.5 | 7.9 | |
| | 4 | | | | ISP-K | 119 | 20.1 | 5.9 | |
| | 5 | | | | — | 139 | 25.3 | 5.5 | |
| | 6 | 20 nm colloidal silica/10 | | | — | 129 | 22.2 | 5.8 | |
| | 7 | 90 nm colloidal silica/10 | | | PAA-K | 101 | 11.2 | 8.9 | |
| Comparative Examples | 1 | #90 fumed silica/10 | — | — | — | 149 | 52.0 | 2.8 | 0 |
| | 2 | | Cationic PMMA/2 | +14 | | 29 | 15.2 | 1.9 | 6 |
| | 3 | | Cationic PS/2 | +18 | | 19 | 14.6 | 1.3 | 19 |
| | 4 | 90 nm colloidal silica/10 | — | — | | 112 | 43.6 | 2.6 | 0 |

According to Table 1, the removal rates in Examples 1 to 7 were adequate at 101 nm/min or more, and the selectivities were also 5.1 or more, indicating them to be useful as aqueous dispersions for STI steps. Also, virtually no scratches were observed, indicating excellent polishing. On the other hand, the selectivities in Comparative Examples 1 and 4 were low at 2.8 and 2.6, respectively, such that they cannot be used as aqueous dispersions for STI steps, and the The DBS-K, PAA-K and IPS-K in Table 2 are the same as in Table 1.

The results are listed in Table 2 together with the results for Example 8.

According to Table 2, the removal rates in Examples 8 to 16 were adequately high at 245 nm/min or more, and the selectivities were also adequately high at 22 or more. Also, no scratches were observed, indicating excellent polishing.

On the other hand, the selectivities in Comparative Examples 5, 8, 9 and 10 were low and numerous scratches were found, demonstrating that they are not suitable for STI use. In Comparative Examples 6 and 7, the insufficient removal rate on the silicon oxide film and numerous scratches constituted a problem.

TABLE 2

| | | Inorganic abrasive Type/content | Organic particles Type/content | Zeta potential | Additive (0.01 wt %) | pH | SiO$_2$ removal rate (nm/min) | Si$_3$N$_4$ removal rate (nm/min) | Selectivity | Scratches (number) |
|---|---|---|---|---|---|---|---|---|---|---|
| Examples | 8 | Ceria/0.3 | Anionic PMMA/0.7 | −25 | — | 6.5 | 299 | 13.6 | 22 | 0 |
| | 9 | | | | DBS-K | | 258 | 8.9 | 24 | |
| | 10 | | | | PAA-K | | 277 | 9.6 | 29 | |
| | 11 | | | | ISP-K | | 245 | 7.9 | 31 | |
| | 12 | | Anionic PS/0.7 | −36 | — | | 332 | 11.5 | 29 | |
| | 13 | Ceria/1 | Anionic PMMA/2 | −25 | — | | 349 | 13.4 | 26 | |
| | 14 | Ceria/2 | Anionic PMMA/4 | | PAA-K | | 398 | 12.4 | 32 | |
| | 15 | Ceria/0.3 | Anionic P PMMA/0.7 | | — | 10.5 | 379 | 17.2 | 22 | |
| | 16 | | | | DBS-K | | 328 | 12.1 | 27 | |
| Comparative Examples | 5 | Ceria/0.3 | — | | — | 6.5 | 308 | 52.2 | 5.9 | 9 |
| | 6 | | Cationic PMMA/0.7 | +14 | | | 93 | 20.7 | 4.5 | 3 |
| | 7 | | Cationic PS/0.7 | +18 | | | 83 | 28.6 | 2.9 | 4 |
| | 8 | | — | — | PAA-K | | 258 | 21.3 | 12.1 | 2 |
| | 9 | | | | — | 10.5 | 341 | 59.1 | 5.8 | 3 |
| | 10 | | | | PAA-K | | 281 | 31.1 | 9 | 2 |

What is claimed is:

1. An aqueous dispersion for chemical mechanical polishing comprising an inorganic abrasive and organic particles with anionic group, wherein an average particle size of said organic particles is 0.01–3Mm, and the removal rate for silicon oxide film is at least 5 times the removal rate for silicon nitride film.

2. An aqueous dispersion for chemical mechanical polishing according to claim 1, wherein said anionic group is at least one selected from the group consisting of carboxyl group, hydroxyl group, sulfuric acid ester group, sulfonic acid group, phosphoric acid group and epoxy group.

3. An aqueous dispersion for chemical mechanical polishing according to claim 2, wherein the zeta potential of said organic particles with said anionic group is −10 mV or lower.

4. An aqueous dispersion for chemical mechanical polishing according to claim 3, wherein said inorganic abrasive is silica.

5. An aqueous dispersion for chemical mechanical polishing according to claim 1, which further comprises an anionic surfactant, wherein when said inorganic abrasive is silica, the removal rate for silicon oxide film is at least 6 times the removal rate for silicon nitride film.

6. An aqueous dispersion for chemical mechanical polishing according to claim 5, wherein said anionic group is at least one selected from the group consisting of carboxyl group, hydroxyl group, sulfuric acid ester group, sulfonic acid group, phosphoric acid group and epoxy group.

7. An aqueous dispersion for chemical mechanical polishing according to claim 6, wherein the zeta potential of said organic particles with said anionic group is −10 mV or lower.

8. An aqueous dispersion for chemical mechanical polishing according to claim 1, which further comprises an anionic surfactant, wherein when said inorganic abrasive is ceria, the removal rate for silicon oxide film is at least 10 times the removal rate for silicon nitride film.

9. An aqueous dispersion for chemical mechanical polishing according to claim 8, wherein said anionic group is at least one selected from the group consisting of carboxyl group, hydroxyl group, sulfuric acid ester group, sulfonic acid group, phosphoric acid group and epoxy group.

10. An aqueous dispersion for chemical mechanical polishing according to claim 9, wherein the zeta potential of said organic particles with said anionic group is −10 mV or lower.

11. An aqueous dispersion for chemical mechanical polishing according to claim 4, wherein said organic particle content is 0.05–10 parts with respect to 100 parts of said aqueous dispersion.

12. An aqueous dispersion for chemical mechanical polishing according to claim 2, wherein said inorganic abrasive is ceria, and the removal rate for silicon oxide film is at least 10 times the removal rate for silicon nitride film.

13. An aqueous dispersion for chemical mechanical polishing according to claim 12, wherein the zeta potential of said organic particles with said anionic group is −10 mV or lower.

14. An aqueous dispersion for chemical mechanical polishing according to claim 13, wherein said organic particle content is 0.02–5 parts with respect to 100 parts of said aqueous dispersion.

15. An aqueous dispersion for chemical mechanical polishing according to claim 4, wherein said organic particle has an anionic group and is comprised of at least one component selected from the group consisting of poly vinyl chloride, polystyrene, styrene-based copolymer, polyacetal, saturated polyester, polyamide, polycarbonate, polyolefin, polyolefin-based copolymer, phenoxy resin, (meth)acrylic resin, (meth)acrylic-based copolymer, copolymeric resin of styrene and/or methyl methacrylate and divinylbenzene and/or ethyleneglycol dimethacrylate, phenol resin, urea resin, melamine resin, epoxy resin, alkyd resin and unsaturated polyester resin.

16. An aqueous dispersion for chemical mechanical polishing according to claim 7, wherein said organic particle has an anionic group and is comprised of at least one component selected from the group consisting of poly vinyl chloride, polystyrene, styrene-based copolymer, polyacetal, saturated polyester, polyamide, polycarbonate, polyolefin, polyolefin-based copolymer, phenoxy resin, (meth)acrylic resin, (meth)acrylic-based copolymer, copolymeric resin of styrene and/or methyl methacrylate and divinylbenzene and/or ethyleneglycol dimethacrylate, phenol resin, urea resin, melamine resin epoxy resin, alkyd resin and unsaturated polyester resin.

17. An aqueous dispersion for chemical mechanical polishing according to claim 10, wherein said organic particle has an anionic group and is comprised of at least one component selected from the group consisting of poly vinyl chloride, polystyrene, styrene-based copolymer, polyacetal, saturated polyester, polyamide, polycarbonate, polyolefin, polyolefin-based copolymer, phenoxy resin, (meth)acrylic resin, (meth)acrylic-based copolymer, copolymeric resin of styrene and/or methyl methacrylate and divinylbenzene and/or ethyleneglycol methacrylate, phenol resin, urea resin, melamine resin, epoxy resin, alkyd resin and unsaturated polyester resin.

18. An aqueous dispersion for chemical mechanical polishing according to claim 13, wherein said organic particle has an anionic group and is comprised of at least one component selected from the group consisting of poly vinyl chloride, polystyrene, styrene-based copolymer, polyacetal, saturated polyester, polyamide, polycarbonate, polyolefin, polyolefin-based copolymer, phenoxy resin, (meth)acrylic resin, (meth)acrylic-based copolymer, copolymeric resin of styrene and/or methyl methacrylate and divinylbenzene and/or ethyleneglycol dimethacrylate, phenol resin, urea resin, melamine resin, epoxy resin, alkyd resin and unsaturated polyester resin.

* * * * *

UNITED STATES PATENT AND TRADEMARK OFFICE
CERTIFICATE OF CORRECTION

PATENT NO. : 6,559,056 B2
DATED : May 6, 2003
INVENTOR(S) : Masayuki Hattori et al.

It is certified that error appears in the above-identified patent and that said Letters Patent is hereby corrected as shown below:

<u>Column 9,</u>
Line 37, "said organic particles is 0.01-3Mm" should read -- said organic particles is 0.01-3$\mu$m --.

Signed and Sealed this

Sixth Day of July, 2004

JON W. DUDAS
*Acting Director of the United States Patent and Trademark Office*